Nov. 12, 1968 E. R. PHILLIPS 3,410,290

FLUID CLOCK PULSE GENERATOR

Filed Oct. 23, 1965

*INVENTOR*
EDWIN R. PHILLIPS

BY Thomas P. Murphy

*AGENT*

3,410,290
FLUID CLOCK PULSE GENERATOR

Edwin R. Phillips, Rosemont, Pa., assignor to Sperry Rand Corporation, New York, N.Y., a corporation of Delaware
Filed Oct. 23, 1965, Ser. No. 503,962
11 Claims. (Cl. 137—81.5)

This invention relates to a clock pulse generator and more particularly to a fluid clock pulse generator providing fluid pulses at a precisely constant rate.

Pure fluid oscillators may, of course, be used as sources of clock pulses. These, however, are subject to variation in the pulse rate caused by changes in pressure and temperature.

The purpose of this invention is to provide a clock pulse generator utilizing a pure fluid oscillator which provides clock pulses at a precise rate unaffected by changes in temperature or pressure. The foregoing is accomplished by synchronizing the pure fluid oscillator with a temperature insensitive mechanical oscillator. The mechanical oscillator provides highly accurate fluid synch pulses to one of the control channels of the fluid oscillator.

The mechanical oscillator used in combination with the fluid oscillator is essentially an oscillating mass-spring system whose period of oscillation is dependent on the value of the mass and spring rate. Since the period of oscillation of the mechanical oscillator of the present invention is completely unaffected by changes in pressure and temperature, it may be used to provide highly accurate synch pulses for synchronization of the fluid oscillator to the natural frequency of oscillation of the mechanical oscillator.

The mechanical oscillator itself could be used to provide a source of clock pulses. However, the mechanical system may have its operation affected by shock at least in the radial direction which shock may cause the momentary failure of the mechanical system. The fluid oscillator is, of course, unaffected by or subject to failure induced by shock.

Thus, the combination of the fluid oscillator and mechanical oscillator of the present invention eliminates the above-mentioned disadvantages of each while at the same time taking advantage of the desirable functional features of each. In operation the clock pulses provided by the fluid oscillator are unaffected by changes in temperature or pressure because the fluid oscillator is synchronized with the mechanical oscillator upon which temperature and pressure have no effect. The synch pulses provided by the mechanical oscillator arrive at the control channel of the fluid oscillator at precise intervals which do not vary over a wide range of temperature and pressure. At the same time, the fluid oscillator is unaffected by vibrational or shock conditions. Thus, if the mechanical oscillator is caused momentarily to fail as a result of shock conditions, the fluid oscillator continues to provide clock pulses albeit at a rate influenced by the fluid temperature and pressure. For the duration of the shock the fluid oscillator is unsynched but becomes synchronized as soon as the shock dissipates.

The fluid oscillator might comprise one having a negative feedback channel connected between respective output channels and the interaction chamber. Also the fluid oscillator may be of the type wherein one of its output channels terminates into an enclosed volume. A fluid stream in the other output channel entrains fluid from the volume until the low pressure therein causes the power stream to switch into the one output channel where it stays until the pressure in the volume builds up to a value which causes the fluid stream to again switch into the other channel. This last type is in practice the one used in the present invention.

The mechanical oscillator comprises a wire torsion spring stretched tight and rigidly fixed at both ends. A mass substantially circular in shape is fixedly mounted on the wire approximately mid-way between its ends. The mass and the spring determine the natural frequency of oscillation of the mechanical oscillator and may be so chosen as to give any desired natural frequency of oscillation. The oscillation, of course, consists of a back and forth torsional or rotative movement of the mass and spring about an axis coincident with the longitudinal axis of the wire spring. The degree of movement in either clockwise or counter-clockwise direction is never more than a few degrees.

The mass is composed of two parts. The first part consists of a drive wheel having a plurality of teeth extending about its periphery and looks much like a gear. A conduit connected to one of the output channels of the fluid oscillator has a nozzle directed at the teeth of the drive wheel in a line substantially tangent to the circnmference of the drive wheel. The fluid pulses from the fluid oscillator are sufficient to initiate and maintain the mechanical oscillator oscillating at its natural frequency.

The second part of the mass, which may be integral with the first part, comprises a wheel having fins disposed about its outer periphery. These fins block and unblock a source of fluid directed to one of the control channels of the fluid oscillator at a rate equal to the natural frequency of the mechanical oscillator. In this way the synch pulses are provided to the fluid oscillator.

Figure 1:
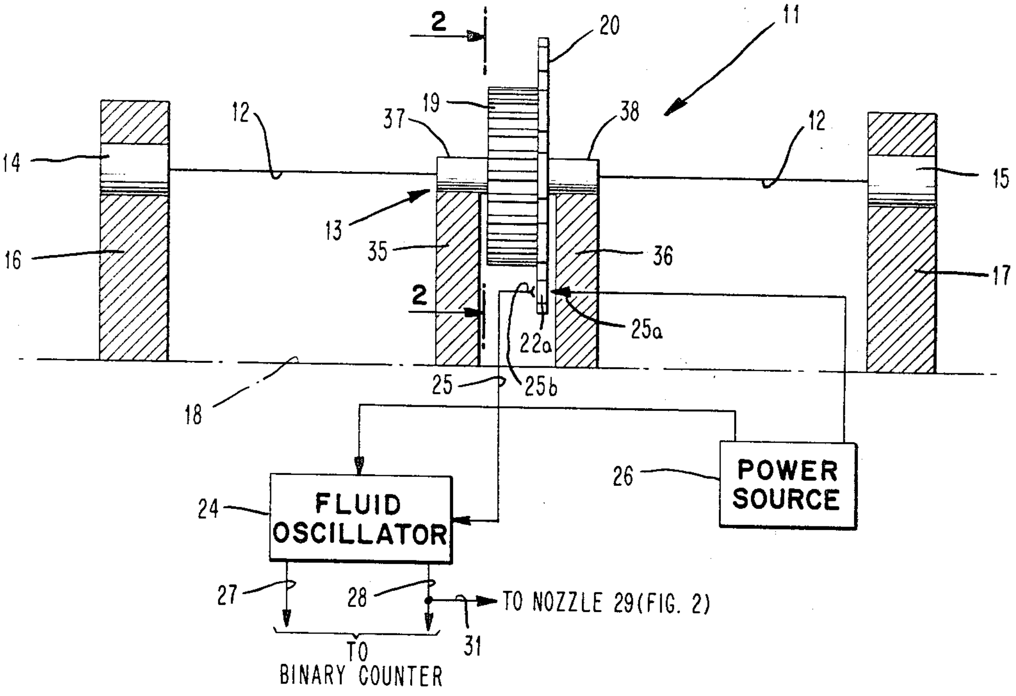
FIGURE 1 is a flat view illustrating a preferred embodiment of the present invention.
Figures 2, 3:
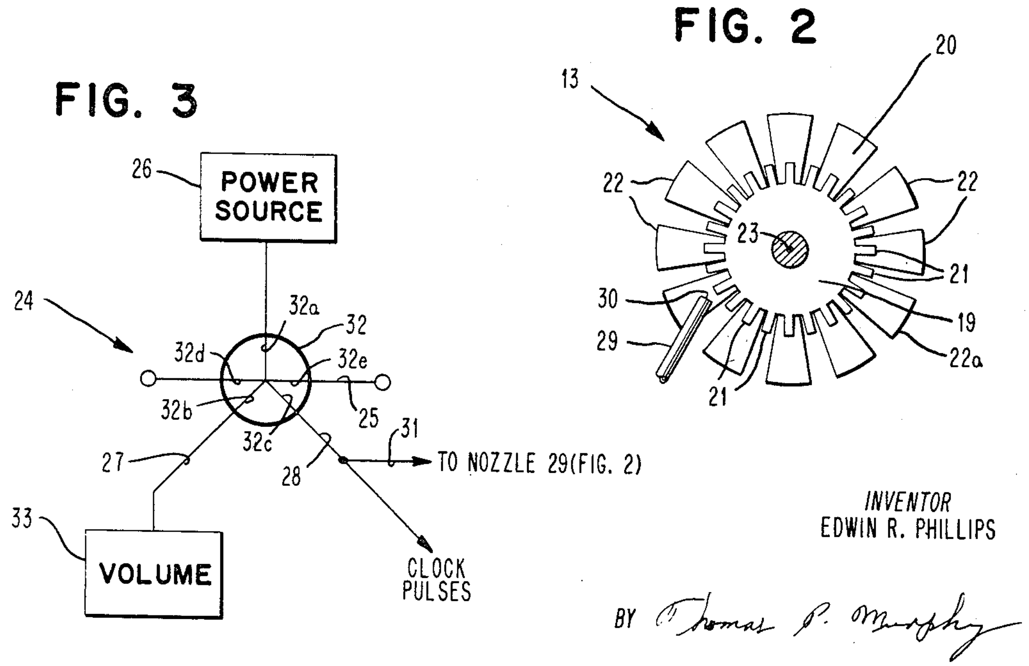
FIGURE 2 is a sectional view of FIGURE 1 taken through lines 2—2.
FIGURE 3 illustrates in schematic form a fluid oscillator which may be used with the present invention.

Referring now more particularly to FIGURES 1 and 2, there is shown mechanical oscillator 11. The mechanical oscillator 11 essentially comprises wire torsion spring 12 and mass 13. The wire torsion spring 12 is stretched tight and fixed at its ends by means of torsion clamps 14 and 15 of any well known type. The torsion clamps 14 and 15 are rigidly secured within the upright supports 16 and 17, respectively. The upright supports 16 and 17 are rigidly fixed to plate member 18 in any convenient manner, for example, by welding or by bolting.

The mass element 13 comprises two parts, that is, a drive wheel 19 and a jet interrupter wheel 20 as best seen in FIGURE 2. The drive wheel is a circular element having a plurality of teeth 21 disposed about its circumference. The teeth 21 of the drive wheel 19 may be formed by cutting much the same as the gear teeth of a gear are formed.

The jet interrupter wheel 20 is also circular in shape and has disposed about its outer periphery or circumference a plurality of equally spaced fins 22. The drive wheel 19 and the jet interrupter wheel 20, which together form the mass 13, are rigidly joined together so that they move as a unit. The mass 13 is rigidly disposed on the wire torsion spring 12 with the wire torsion spring 12 passing through an axial aperture 23 through the mass 13.

Since the wire torsion spring 12 and the mass 13 are rigidly fixed to each other, rotation of the mass 13 causes a torsional movement of the wire 12. The spring constant of the wire torsion spring 12, as well as its free length, determine the natural frequency of oscillation of the mechanical oscillator 11. Thus, a rotational motive force, for example, fluid pulses applied to the teeth 21 of the drive wheel 19 initiate and maintain torsional or rotational oscillation at its natural frequency of the mass-torsional spring oscillating system of the mechanical oscillator 11.

Without going into a mathematical analysis of the presently described type of mechanism oscillating systems suffice it to say that a mass and length of torsion spring wire may be so selected as to provide any desired natural frequency of oscillation. The following equation is useful to design a mechanical oscillator with a desired frequency of oscillation:

$$W_0=\sqrt{\frac{4r^4G}{R^4maL}}$$

where $W_0$=natural frequency of system.
$G$=torsional modulus of wire.
$r$=radius of wire.
$R$=radius of disk.
$m$=density of disk.
$a$=width of disk.
$L$=length of the wire.

The amplitude of oscillation of the mechanical oscillator 11 is small covering only a few degrees, for example, five or six degrees out of a possible 360°.

A fluid conduit 25 comprising two parts 25*a* and 25*b* disposed on each side of a selected fin 22*a* of the interrupter wheel 20 has one end connected to a power source 26 and the other end connected to a control channel of the fluid oscillator 24 shown as a block in FIGURE 1. The fluid oscillator 24 may be of the type shown and described below in connection with FIGURE 3. The selected fin 22*a* functions to interrupt the fluid jet or control stream connected to the control channel of the fluid oscillator 24 at a rate equal to the frequency of oscillation of the mechanical oscillator 11. The fluid oscillator 24 has its input channel connected to the power source 26. The fluid oscillator 24 has two output channels 27 and 28 either of which may serve to provide the clock pulses. The pulses supplied to the control channel of the oscillator 24 coming at a rate equal to the frequency of oscillation of the mechanical oscillator 11 serve to synchronize the rate of oscillation of the fluid oscillator 24 to the frequency of oscillation of the mechanical oscillator 11. Thus, if the mechanical oscillator 11 is oscillating at its natural frequency, the conduit 25 provides the control channel of the fluid oscillator 24 with a series of pulses recurring at the precise natural frequency of oscillation of the mechanical oscillator 11 which in turn constrains the fluid oscillator 24 to provide alternate fluid pulses in its output channels 27 and 28 at a frequency equal to the natural frequency of oscillation of the mechanical oscillator 11.

A fluid drive nozzle 29 has its open end 30 disposed adjacent the teeth 21 of the drive wheel 19 in such a direction that fluid from the nozzle 29 is directed against the teeth 21 to provide the force necessary to initiate and maintain the mass 13 and wire torsion spring 12 in oscillation. The tendency of the mechanical oscillator 11 to oscillate at its natural frequency is so strong that the degree of motive force provided by the nozzle 29 is not critical as long as it is sufficient to overcome the initial inertia of the system. The nozzle 29 is connected by means of conduit 31 to the output channel 28 of the fluid oscillator 24. Therefore, initiation of oscillations in the fluid oscillator 24 in any manner provides a train of fluid pulses to the nozzle 29 to institute and maintain oscillation of the mechanical oscillator 11. When this occurs, the synchronizing pulses arriving at the control channel of the fluid oscillator 24 via the conduit 25 very quickly synchronize the rate of oscillation of the fluid oscillator 24 to that of the mechanical oscillator 11 which rate, of course, is equal to the natural frequency of oscillation of the oscillator 11.

Although the interrupter wheel 20 has been shown with a plurality of fins 22, it should be understood that only one fin (fin 22*a* in this case) is necessary to provide the synchronizing pulses to the control channel of the fluid oscillator 24. The rest of the plurality of fins are shown since such a construction provides a symmetrically balanced system which is necessary for the mechanical oscillator 11 of the present invention. Such a construction also provides a plurality of position at which the conduit 25 may be conveniently placed.

Jewel journals 37 and 38 are positioned, respectively, on each side of the mass 13. The jewel journals 37 and 38 may be cylindrical in shape and have openings along their longitudinal axes to permit the wire torsion spring 12 to pass therethrough. The journals 37 and 38 are rigidly held in position by means of upright supports 35 and 36, respectively. The upright supports 35 and 36, of course, are securedly fixed at their bases to the plate 18. These journals substantially eliminate the effect of the vibrational and shock forces applied perpendicularly to the wire torsion spring 12.

Referring now particularly to FIGURE 3 there is shown a schematic of the fluid oscillator 24 used in the present invention. It comprises a bi-stable fluid amplifier 32 of the lock-on or boundary layer type. The fluid amplifier 32 comprises an input channel 32*a*, output channels 32*b* and 32*c* and control channels 32*d* and 32*e*. The input channel 32*a* is connected to the power source 26. The control channel 32*e* is connected to the conduit 25 of FIGURE 1. Although shown it should be noted that the control channel 32*d* is not necessary for the purposes of the present invention and may be thought of as an additional control means for use if desired. The output channel 32*b* terminates in an enclosed volume 33.

The output channel 32*c* of the amplifier 32 when extended becomes the output channel 28 of the fluid oscillator 24. This is the output channel which provides the clock pulses as well as the fluid drive for the drive wheel 19. When an oscillator of the type shown in FIGURE 3 is used as the oscillator 24, there is, of course, no output channel 27 as shown in FIGURE 3 because the output channel is terminated at volume 33. The output channel 32*b* of the bi-stable amplifier and the enclosed volume 33 would not in such a case be external to the block showing of the fluid oscillator 24 of FIGURE 1.

In operation when a power stream is in the output channel 32*c*, fluid is entrained from the enclosed volume 33 thereby lowering the pressure within that volume. When the pressure within the volume 33 reaches a predetermined amount, the power stream switches from the output channel 32*c* into the output channel 32*b*. When this occurs, the pressure within the enclosed volume 33 begins to build up. After a predetermined time the pressure within the enclosed volume 33 reaches a value which produces a sufficient back pressure to cause the power stream to switch from the output channel 32*b* back into the output channel 32*c*. This switching occurs cyclically. The fluid amplifier depicted in FIGURE 3 will be synchronized to oscillate at the rate at which the synch pulses occurring at the conduit 25 are applied to the control channel 32*e*. Of course the fluid oscillator 24 as shown in FIGURE 3 may be geometrically optimized to operate at a desired frequency thus enabling the synch pulses occurring at the control channel 32*e* to rapidly pull in the frequency of the fluid oscillator 24 to that of the natural frequency of oscillation of the mechanical oscillator 11. The clock pulses, which occur in the output channel 28, are precisely timed and may be applied directly to a binary counter or other utilization device. Alternately, these pulses may be applied to a binary counter or other utilization device through a fluid amplifier if amplification were necessary.

The embodiments of the invention in which an exclusive property or privilege is claimed are defined as follows:

1. A fluid clock pulse generator, comprising in combination: a fluid oscillator having a predeterminable frequency of oscillation, a mechanical oscillator having a natural frequency of oscillation related to that of the fluid oscillator, first means connected between said fluid oscillator and said mechanical oscillator controlling the rate of oscillation of said fluid oscillator in accordance with the rate of oscillation of said mechanical oscillator, and means connected between said fluid oscillator and said mechanical oscillator for driving the mechanical oscillator.

2. A clock pulse generator according to claim 1 wherein said mechanical oscillator comprises: a wire torsion spring fixed at both ends, a mass disposed on said wire torsion spring fixing the natural frequency of oscillation of said mechanical oscillator.

3. A clock pluse generator according to claim 2 further comprising journal bearing means disposed on each side of said mass for preventing movement of said wire torsion spring in directions perpendicular thereto.

4. A clock pulse generator according to claim 1 wherein said fluid oscillator comprises at least one output channel and at least one control channel, and said first means comprises a fluid source normally connected to said control channel which is disconnected therefrom by said mechanical oscillator at a rate equal to the frequency of oscillation of said mechanical oscillator.

5. A clock pulse generator according to claim 2 wherein said fluid oscillator comprises at least one output channel and at least one control channel, and said first means comprises a fluid source normally connected to said control channel which is disconnected therefrom by said mechanical oscillator at a rate equal to the frequency of oscillation of said mechanical oscillator.

6. A clock pulse generator according to claim 5 further comprising journal bearing means disposed on each side of said mass for preventing movement of said wire torsion spring in directions perpendicular thereto.

7. A clock pulse generator according to claim 1 wherein said mechanical oscillator comprises: a wire torsion spring fixed at both ends, a mass disposed on said wire torsion spring fixing the natural frequency of oscillation of said wire torsion spring, means causing said wire torsion spring and mass to oscillate in the torsional direction at said natural frequency, a source of fluid connected to a control channel of said fluid oscillator, means fixed to said mass disconnecting said source of fluid from said control channel at a rate equal to said natural frequency.

8. A clock pulse generator according to claim 1 wherein said fluid oscillator comprises at least one output channel and at least one control channel; and said mechanical oscillator comprises a wire torsion spring held taut and fixed at both ends, a mass disposed on said wire torsion spring fixing the natural frequency of oscillation of said wire torsion spring; nozzle means connected to said output channel and disposed to direct fluid in said output channel against said mass to initiate and maintain torsional oscillation of said mass and wire torsion spring at said natural frequency, a source of fluid connected to said control channel, interrupter means forming part of said mass for disconnecting said source of fluid from said control channel at a rate equal to said natural frequency whereby said fluid oscillator is contrained to oscillate at said natural frequency.

9. A clock pulse generator according to claim 8 wherein said mass comprises a drive wheel and an interrupter wheel rigidly disposed on said wire torsion spring for oscillatory rotation with said wire torsion spring about an axis coincident with the longitudinal axis of said wire torsion spring, said drive wheel comprising a plurality of teeth disposed on its circumference against which fluid from said nozzle means is directed, said interrupter wheel comprising a plurality of fins one of which is disposed to block and unblock said power source from said control channel at a rate equal to said natural frequency.

10. A clock pulse generator according to claim 8 further comprising journal bearing means disposed on each side of said mass for preventing movement of said wire torsion spring in directions perpendicular thereto.

11. A fluid clock pulse generator, comprising in combination: a fluid oscillator having an input channel, first and second output channels and at least one control channel, a source of fluid connected to said input channel providing a jet stream which oscillates between said first and second output channels, means connected to said control channel providing synch pulses to said fluid oscillator at a constantly recurring rate unaffected by changes in temperature and pressure of said fluid, and means driving said synch pulse means from the output of said fluid oscillator.

References Cited

UNITED STATES PATENTS

| | | | |
|---|---|---|---|
| 3,124,999 | 3/1964 | Woodward | 137—81.5 XR |
| 3,136,326 | 6/1964 | Bryant | 137—36 |
| 3,204,652 | 9/1965 | Bauer | 137—81.5 |
| 3,260,271 | 7/1966 | Katz | 137—81.5 XR |
| 3,260,456 | 7/1966 | Boothe | 137—81.5 XR |
| 3,275,015 | 9/1966 | Meier | 137—81.5 |
| 3,311,987 | 4/1967 | Blazek | 137—81.5 XR |

SAMUEL SCOTT, *Primary Examiner.*